United States Patent
Miyazaki

(10) Patent No.: US 8,692,968 B2
(45) Date of Patent: Apr. 8, 2014

(54) CHIP COMPONENT MOUNTING STRUCTURE, CHIP COMPONENT MOUNTING METHOD AND LIQUID CRYSTAL DISPLAY DEVICE

(75) Inventor: Hiroki Miyazaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 206 days.

(21) Appl. No.: 13/257,679

(22) PCT Filed: Nov. 4, 2009

(86) PCT No.: PCT/JP2009/068787
§ 371 (c)(1),
(2), (4) Date: Sep. 20, 2011

(87) PCT Pub. No.: WO2010/109718
PCT Pub. Date: Sep. 30, 2010

(65) Prior Publication Data
US 2012/0008064 A1 Jan. 12, 2012

(30) Foreign Application Priority Data

Mar. 26, 2009 (JP) .................................. 2009-075336

(51) Int. Cl.
G02F 1/1345 (2006.01)
G02F 1/13 (2006.01)
H01L 21/00 (2006.01)
H05K 1/02 (2006.01)

(52) U.S. Cl.
USPC ............ 349/150; 349/192; 438/119; 174/259

(58) Field of Classification Search
USPC ............ 349/150, 192; 438/118, 119; 174/259
See application file for complete search history.

(56) References Cited

U.S. PATENT DOCUMENTS

| 5,858,806 | A | 1/1999 | Nishida |
| 5,930,603 | A | 7/1999 | Tsuji et al. |
| 6,388,321 | B1 * | 5/2002 | Hirai et al. ..................... 257/737 |
| 6,981,317 | B1 * | 1/2006 | Nishida .......................... 29/840 |

(Continued)

FOREIGN PATENT DOCUMENTS

| EP | 1 304 742 A2 | 4/2003 |
| JP | 2000-068633 A | 3/2000 |

(Continued)

OTHER PUBLICATIONS

Official Communication issued in International Patent Application No. PCT/JP2009/068787, mailed on Dec. 8, 2009.

Primary Examiner — K. Cyrus Kianni
Assistant Examiner — Robert Tavlykaev
(74) Attorney, Agent, or Firm — Keating & Bennett, LLP

(57) ABSTRACT

Provided are a chip component mounting structure and a chip component mounting method, wherein when a plurality of chip components having different heights are mounted on a substrate via an anisotropic conductive film, position gaps which occur when the chip components are pressure-bonded to the substrate are prevented, and the chip components can be accurately mounted to the substrate at target positions; and a liquid crystal display device provided with the substrate. In the chip component mounting structure, a position fixing resin (4) for maintaining the orientation of chip components (2) which are pressure-bonded to a substrate (1) via an anisotropic conductive film (7) is provided. In the chip component mounting method, after the position fixing resin (4) for maintaining the orientation of the chip components (2) which are mounted to the substrate (1) via the anisotropic conductive film (7) is applied to the substrate (1) and cured, the chip components (2) are heated at a predetermined temperature and pressed at a predetermined pressure via an elastic sheet (5) provided on the chip components (2) and, then, pressure-bond to the substrate (1) together. The liquid crystal display is provided with such a substrate.

5 Claims, 7 Drawing Sheets

(56) References Cited

U.S. PATENT DOCUMENTS

| | | | |
|---|---|---|---|
| 8,291,582 B2 * | 10/2012 | Nishikawa et al. | 29/840 |
| 2002/0053735 A1 * | 5/2002 | Neuhaus et al. | 257/728 |
| 2004/0224441 A1 * | 11/2004 | Saito | 438/119 |
| 2009/0039291 A1 | 2/2009 | Furuta et al. | |
| 2009/0133900 A1 | 5/2009 | Nishikawa et al. | |
| 2013/0010436 A1 | 1/2013 | Nishikawa et al. | |

FOREIGN PATENT DOCUMENTS

| | | |
|---|---|---|
| JP | 2004-273853 A | 9/2004 |
| WO | 97/39380 A1 | 10/1997 |
| WO | 99/63527 A2 | 12/1999 |
| WO | 03/029883 A1 | 4/2003 |
| WO | 2006/112383 A1 | 10/2006 |
| WO | 2007/094167 A1 | 8/2007 |

* cited by examiner

CHIP COMPONENT MOUNTING STRUCTURE, CHIP COMPONENT MOUNTING METHOD AND LIQUID CRYSTAL DISPLAY DEVICE

TECHNICAL FIELD

The present invention relates to a chip component mounting structure, a chip component mounting method and a liquid crystal display device, and more particularly, to a chip component mounting structure, a chip component mounting method and a liquid crystal display device that are preferable for mounting at a time a plurality of chip components, which have different heights, on a base board.

BACKGROUND ART

Conventionally, a mounting method is performed, in which chip components (IC, resistor, capacitor and the like) are press-bonded on a liquid crystal module, a glass base board, or a plastic base board at a time by using an adhesion material such as an anisotropic electro-conductive film and the like.

The anisotropic electro-conductive film (also called ACF) is a high-molecular film in which electro-conductive particles (solder, or a material in which plating is applied to resin balls) are dispersed; and is a connection material that has three functions of adhesion, electrical conductivity and insulation. By press-bonding with the anisotropic electro-conductive film interposed between upper and lower base boards or between a base board and a chip component, it is possible to: electrically connect upper and lower electrodes to each other via the electro-conductive particles; give electrical conductivity in a vertical thickness direction; and give insulation in a surface direction. Because of this, the anisotropic electro-conductive film is preferably used for bonding base boards to each other and mounting a chip component on a base board.

Besides, a method is also performed, in which the anisotropic electro-conductive film is attached to electrode portions such as a connection bump and the like that are disposed on a base board; a plurality of chip components are mounted on the anisotropic electro-conductive film; a press-bonding head is placed on the chip components; pressing is performed while heating in whole to perform the press-bonding at a time. Here, considering unevenness in height dimensions of the components (e.g., chip components) to be press-bonded, a press-bonding method is already proposed, in which an elastic sheet is interposed between the press-bonding head and the component to be press-bonded; and the heating and pressing are performed by means of the press-bonding head, whereby defective press-bonding is prevented (e.g., see a patent document 1).

Besides, a liquid crystal display device is so structured as to include: a liquid crystal panel portion in which liquid crystal is injected between two glass base boards; and a wiring region where chip components like a drive IC chip and the like and various electronic components are mounted on a glass base board around the liquid crystal panel portion. Because of this, conventionally, a mounting method is employed, in which a plurality of chip components are press-bonded at a time by using an adhesion material such as the anisotropic electro-conductive film and the like. Besides, on the base board that serves as the wiring region, a flexible printed wiring board (FPC), which is connected to a wiring and an external signal output means, is disposed.

To achieve size reduction and sophisticated function of a liquid crystal display device on which many chip components are mounted, it is important to mount, in a limited space, a plurality of chip components at accurate positions and in correct attitudes. Besides, connection reliability is also required which allows correct electrical connection between chip components and connection portions like an electrode, a connection bump and the like formed on a base board.

Even if the performance of a chip component to be mounted is good, if the component is not accurately mounted on a base board, a product (liquid crystal display device) which fulfills a predetermined performance is not obtained and stabilization of the product quality is not achieved, which leads to a defective product.

CITATION LIST

Patent Literature

PLT1: JP-A-2000-68633

SUMMARY OF INVENTION

Technical Problem

When mounting a plurality of chip components on a base board, by: heating and pressing by means of a press-bonding head with an elastic sheet interposed between the press-bond head and components to be press-bonded, it is possible to perform the press-bonding at a time while absorbing unevenness in a height direction of the plurality of components to be press-bonded and preventing defective press-bonding.

However, when press-bonding a plurality of different kinds of chip components at the same time, in a case where unevenness in the height dimensions is large, as the interposed elastic sheet, a thick elastic sheet is used, so that a deformation amount of the elastic sheet becomes large; during the press time, not only force in a press direction (perpendicular to the base board) but also force in a lateral direction (direction horizontal to the base board) are likely to occur. If the lateral-direction force occurs, the chip component deviates from the mounted position, which raises a problem that electrical connection reliability between the connection bump and a desired chip component on the base board is damaged.

For example, as shown in FIG. 7 (a), on a connection bump disposed on a base board 1, chip components 21, 22 having substantially the same height dimension and a chip component 23 having a height different from the chip components 21, 22 are mounted via an anisotropic electro-conductive film 7; an elastic sheet 5 is placed and the press-bonding is performed at a time; in this case, the unevenness in the height dimension is large, so that a portion having a small deformation amount and a portion having a large deformation amount occur. And, because of a difference between the deformation amounts, the lateral-direction force occurs, which as shown in FIG. 7 (b), brings a risk that the components turn into chip components 21A, 22A and 23A at positions deviated from the proper mounted positions.

Because of this, when mounting the plurality of chip components having different heights on the base board via the anisotropic electro-conductive film, it is required to: absorb the unevenness in the height dimension by using a thick elastic sheet; and make it possible to prevent the positional deviation and mount the components at the accurate positions on the base board. Besides, a liquid crystal display device is desired which includes a wiring board on which a plurality of chip components are mounted and fulfills a predetermined performance.

Accordingly, the present invention, in light of the above problems, has an object to provide: a chip component mounting structure and a chip component mounting method that when mounting a plurality of chip components having different heights on a base board via an anisotropic electro-conductive film, allow the mounting at the accurate positions on the base board by preventing the positional deviation which occurs during the press-bonding; and a liquid crystal display device that includes the base board.

Solution to Problem

To achieve the above object, the present invention is a chip component mounting structure in which a plurality of chip components are placed on a base board via an anisotropic electro-conductive film; and mounted by press-bonding at a time by using a press-bonding head, the chip component mounting structure performs the press-bonding by interposing a position fixing resin that maintains placed attitudes of the chip components which are placed on the anisotropic electro-conductive film.

According to this structure, the chip components are press-bonded with the attitudes maintained by interposing the position fixing resin, which leads to a chip component mounting structure that is able to prevent the sideward deviation which occurs during the press-bonding and mount the chip components placed on the base board at the accurate positions.

Besides, in the chip component mounting structure having the above structure according to the present invention, the position fixing resin is a liquid-like setting resin which has a coating thickness lower than heights of the chip components; and is set with top portions of the chip components exposed. According to this structure, it is possible to apply the liquid-like setting resin by means of a dispenser method to the chip components that are held by the adhesion of the anisotropic electro-conductive film. Besides, by only applying the liquid-like setting resin to an extent where the top portions of the chip components are exposed, by setting the liquid-like setting resin, it is possible to fix the chip components at the accurate positions and in the correct attitudes.

Besides, in the chip component mounting structure having the above structure according to the present invention, the position fixing resin is the liquid-like setting resin which has a coating thickness lower than the height of the highest chip component of the chip components; and is set with the top portion of the highest chip component exposed. According to this structure, the top portion of the highest chip component is exposed; accordingly, when disposing other members on the chip components, it is possible to maintain a predefined design dimension.

Besides, in the chip component mounting structure having the above structure according to the present invention, the base board includes a flexible printed wiring board having a height lower than the heights of the chip components; and a coating thickness of the position fixing resin is made higher than the height of the flexible printed wiring board. According to this structure, even in a case where there is a large difference between the height of the chip component and the height of the flexible printed wiring board, by making the coating thickness of the position fixing resin thick, it is possible to press-bond the flexible printed wiring board along with the chip components via the position fixing resin at a time.

Besides, the present invention is a chip component mounting method which places the plurality of chip components on the base board via the anisotropic electro-conductive film; and performs the press-bonding at a time by using the press-bonding head, the chip component mounting method applies the position fixing resin that maintains the placed attitudes of the chip components which are placed on the anisotropic electro-conductive film; sets the position fixing resin; thereafter, places an elastic sheet on the chip components; performs heating at a predetermined temperature; performs pressing at a predetermined pressure to perform the press-bonding.

According to this structure, the plurality of chip components are placed on the base board via the anisotropic electro-conductive film; thereafter, the position fixing resin is applied and set; and the press-bonding is performed in a state where the placed attitudes are maintained, which leads to a chip component mounting method that is able to prevent the chip components from deviating sideward even if the elastic sheet is deformed and the force is exerted in the lateral direction when performing the press-bonding with the elastic sheet placed.

Besides, in the chip component mounting method having the above structure according to the present invention, the position fixing resin is the liquid-like setting resin and applied to a coating thickness lower than the heights of the chip components; and the press-bonding is performed in the state where the top portions of the chip components are exposed. According to this structure, it is possible to apply the liquid-like setting resin by means of the dispenser method to the chip components that are held by the adhesion of the anisotropic electro-conductive film. Besides, by only applying the liquid-like setting resin to an extent where the top portions of the chip components are exposed, by setting the liquid-like setting resin, a chip component mounting method is obtained which is able to fix the chip components at the accurate positions and in the correct attitudes.

Besides, in the chip component mounting method having the above structure according to the present invention, the position fixing resin is the liquid-like setting resin and applied to a coating thickness lower than the height of the highest chip component of the chip components; and is set with the top portion of the highest chip component exposed to perform the press-bonding. According to this structure, the position fixing resin is set with the top portion of the highest chip component exposed, which leads to a chip component mounting method that is able to dispose the other members exactly on the chip components in accordance with the predefined predetermined design dimension.

Besides, in the chip component mounting method having the structure according to the present invention, the base board includes the flexible printed wiring board having a height lower than the heights of the chip components; and the coating thickness of the position fixing resin is made thicker than the height of the flexible printed wiring board. According to this structure, even in a case where there is a large difference between the height of the chip component and the height of the flexible printed wiring board, by making the coating thickness of the position fixing resin thick, without making the thickness of the placed elastic sheet thick, it is possible to press-bond the flexible printed wiring board along with the chip components via the position fixing resin at a time.

Besides, the present invention is a liquid crystal display device that includes a liquid crystal display panel and a backlight unit; wherein a base board of the liquid crystal display panel is a base board on which the plurality of chip components are placed via the anisotropic electro-conductive film; the chip components are mounted at a time by using the press-bonding head; and the press-bonding is performed by interposing the position fixing resin that maintains the placed attitudes of the chip components which are placed on the anisotropic electro-conductive film.

According to this structure, the chip components are press-bonded to the base board with the position fixing resin interposed, so that it is possible to prevent the sideward deviation that occurs during the press-bonding, which leads to a base board in which the chip components placed on the base board are mounted at the accurate positions. Because of this, the connection reliability between the base board and the chip components improves and it is possible to obtain a liquid crystal display device that fulfills a desired performance.

Besides, in the liquid crystal display device having the above structure according to the present invention, the position fixing resin is the liquid-like setting resin and applied to a coating thickness lower than heights of the chip components; and is set with the top portions of the chip components exposed. According to this structure, it is possible to apply the liquid-like setting resin by means of the dispenser method to the chip components that are held by the adhesion of the anisotropic electro-conductive film. Besides, by applying the liquid-like setting resin to an extent where the top portions of the chip components are exposed and setting the liquid-like setting resin, a liquid crystal display device is obtained which fixes the chip components at the accurate positions and in the correct attitudes and fulfills the desired performance.

Besides, in the liquid crystal display device having the above structure according to the present invention, the position fixing resin is the liquid-like setting resin and applied to a coating thickness lower than the height of the highest chip component of the chip components; and is set with the top portion of the highest chip component exposed to perform the press-bonding. According to this structure, the position fixing resin is set with the top portion of the highest chip component is exposed, which leads to a liquid crystal display device which is able to dispose the other members exactly in accordance with the predefined predetermined design dimension, does not injure a desired performance of the base board and fulfills the desired performance.

Besides, in the liquid crystal display device having the above structure according to the present invention, the base board includes the flexible printed wiring board having a height lower than the heights of the chip components; and the coating thickness of the position fixing resin is made thicker than the height of the flexible printed wiring board. According to this structure, even in a case where there is a large difference between the height of the chip component and the height of the flexible printed wiring board, by making the coating thickness of the position fixing resin thick, it is possible to press-bond the flexible printed wiring board along with the chip components via the position fixing resin at a time. Because of this, a liquid crystal display device is obtained which is able to fix the chip components and the flexible printed wiring board at the accurate positions without the positional deviation, which leads to a liquid crystal display device that fulfills the desired performance.

Advantageous Effects of Invention

According to the present invention, the chip component mounting structure is provided in which the press-bonding is performed by interposing the position fixing resin that maintains the placed attitudes of the chip components which are placed on the base board via the anisotropic electro-conductive film, which leads to the chip component mounting structure that is able to prevent the sideward deviation which occurs during the press-bonding and mount the chip components placed on the base board at the accurate positions. Besides, the chip component mounting method is provided which applies and sets the position fixing resin that maintains the placed attitudes of the chip components which are placed on the base board via the anisotropic electro-conductive film; thereafter, places the elastic sheet on the chip components; performs the heating at the predetermined temperature; performs the pressing at the predetermined pressure to perform the press-bonding at a time, which leads to the chip component mounting method which is able to prevent the chip components from deviating sideward even if the elastic sheet is deformed and the force is exerted in the lateral direction when performing the press-bonding with the elastic sheet placed. Besides, the liquid crystal display device which includes the base board is provided, so that it is possible to provide the liquid crystal display device that includes a wiring board on which the plurality of chip component are accurately mounted; and fulfills the desired performance.

DESCRIPTION OF EMBODIMENTS

Hereinafter, embodiments of the present invention are described with reference to the drawings. Besides, the same constituent members are indicated by the same reference numbers and detailed description is suitably skipped.

Figure 1:
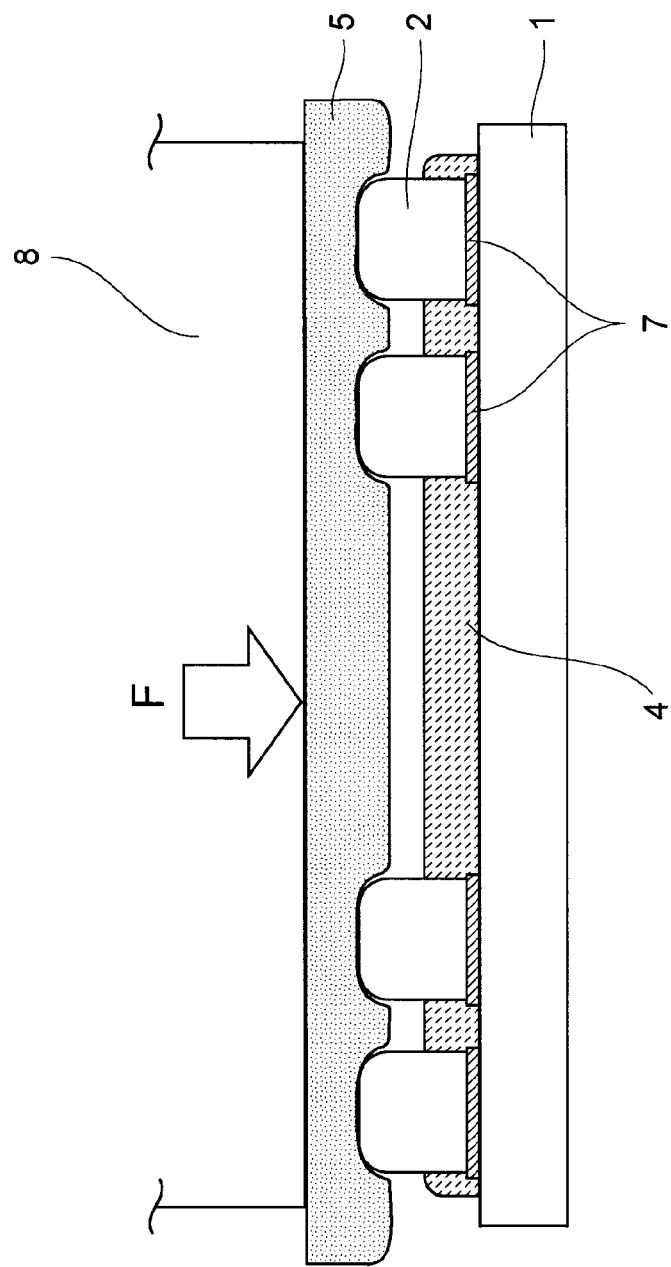
FIG. 1 is a schematic sectional view describing a chip component mounting method according to the present invention.
Figure 2A:
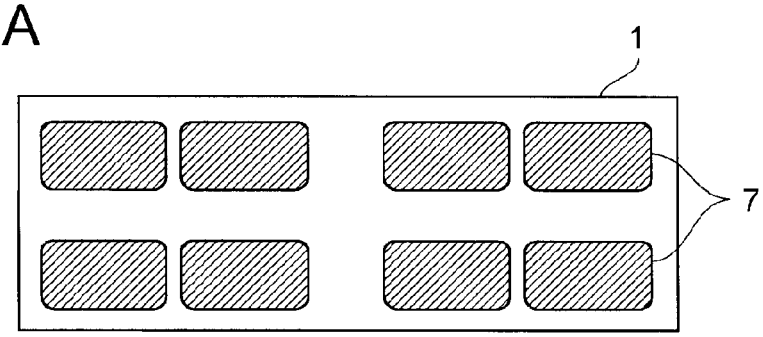
FIG. 2 is a descriptive view showing a procedure of a chip component mounting method according to the present invention, of which (a) shows a state in which an anisotropic electro-conductive film is attached to a connection pad on a base board; (b) shows a state in which a chip component is placed; (c) shows a state in which a position fixing resin is applied; and (d) shows a sectional view of a finished product.
Figure 2B:
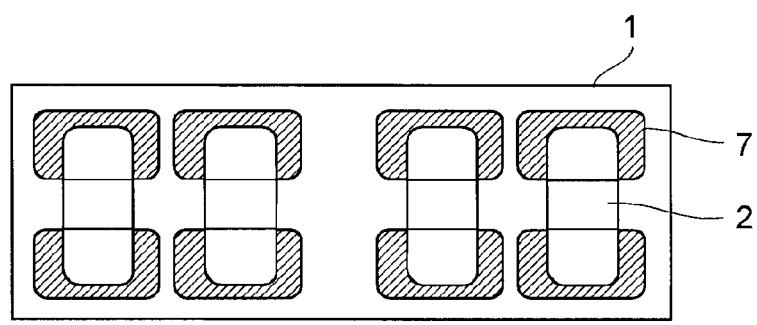
Figure 2C:
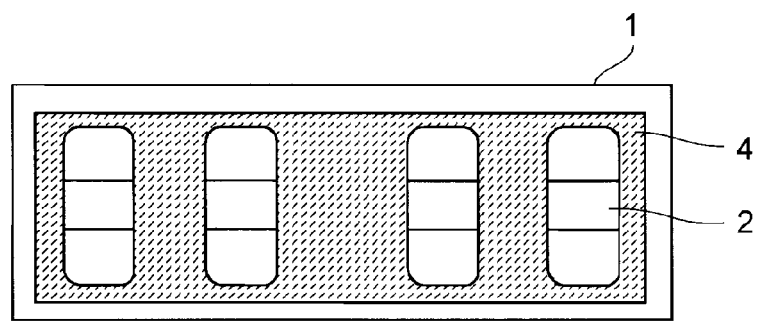
Figure 2D:
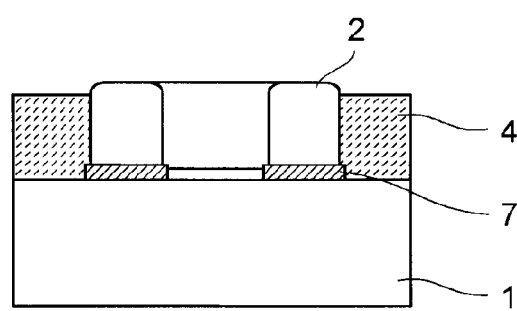

First, by using FIG. 1 and FIG. 2, a chip component mounting method according to the present embodiment is described.

As shown in FIG. 1, the chip component mounting method according to the present embodiment is a chip component mounting method that when mounting a plurality of chip components 2 on a base board 1 on which a predetermined wiring is formed, attaches an anisotropic electro-conductive film 7 onto connection portions such as a predetermined electrode, a connection pad and the like that are disposed on the base board 1 in advance; places the chip components 2 on the anisotropic electro-conductive film 7; places an elastic sheet 5 on the chip components 2; performs pressing at a predetermined pressure F via a press-bonding head 8 while heating at a predetermined temperature to perform the press-bonding at a time.

Besides, here, a structure is employed, in which after the chip components 2 are placed on the anisotropic electro-conductive film 7, a position fixing resin 4, which maintains placed attitudes of the chip components 2, is applied and set; thereafter, the press-bonding is performed via the elastic sheet 5 and the press-bonding head 8.

The anisotropic electro-conductive film 7, as described above, is a connection material that has the three functions of adhesion, electrical conductivity and insulation; accordingly, the anisotropic electro-conductive film 7 is able to be attached to a predetermined position of the base board; and it is possible to place the chip components on the anisotropic electro-conductive film 7 applied on the base board and temporarily fix the chip components.

It is preferable that the position fixing resin 4 is a liquid-like setting resin. Besides, a resin is preferable that sets at a temperature at which the anisotropic electro-conductive film 7 does not set; and after the setting, has resistance to the heating temperature during the press-bonding time. For example, it is possible to use a photo-setting resin such as an epoxy resin and the like that is set by ultraviolet rays. Besides, the coating thickness is sufficient to be a thickness that is able to positionally fix the chip components 2 such that the chip components 2 do not deviate positionally after the setting and may have a height lower than the heights of the chip components 2. If the coating thickness of the position fixing resin 4 is made to have a thickness lower than the heights of the chip components 2, a structure is obtained, in which top portions of the chip components 2 are exposed. Because of this, a chip component mounting method is obtained which is able to dispose other members exactly on the chip components 2 in accordance with a predefined predetermined design dimension.

Besides, in a case where the heights of the plurality of chip components 2 are different from each other, it is preferable that the coating thickness has a height lower than the height of the highest chip component. This is because there is a case where other components are disposed on the chip components 2; by exposing the top portion of the highest chip component 2, it is possible to form a predetermined design step even if the other components are disposed. Because of this, it is possible to say that it is preferable that the coating thickness of the position fixing resin 4 is lower than the heights of chip components 2 on which the other members are likely to be disposed.

Besides, as for the liquid-like setting resin, it is possible to apply the liquid-like setting resin to an arbitrary height by means of the Spensor method around the chip component 2 that is held by the adhesion of the anisotropic electro-conductive film 7, which is preferable.

It is sufficient if the elastic sheet 5 is a sheet that is flexible and has resistance to heat; for example, it is possible to use a rubber sheet that has resistance to heat. Here, in a case of a type in which the press-bonding head 8 is provided with a heater, the elastic sheet 5, which has a high-heat conductivity to easily conduct heat from the heater to the anisotropic electro-conductivity film 7, is preferable. Besides, in a case of a type in which a heater is disposed on a table on which the base board is placed, the heating is performed with the elastic sheet not interposed, so that the function for conducting the heat becomes unnecessary; and an elastic sheet having a low heat conductivity is enough.

On the base board 1, a predetermined wiring is formed; and at predetermined positions, connection portions such as an electrode, a connection bump and the like for connecting predetermined electronic components to the predetermined positions are disposed. As shown in FIG. 2 (*a*), the anisotropic electro-conductive films 7 are attached to the connection portions. Then, as shown in FIG. 2 (*b*), on the anisotropic electro-conductive films 7, the predetermined electronic components, for example, the chip components 2 are placed. The anisotropic electro-conductive film 7, as described above, has the adhesion, so that the chip components 2 placed on the anisotropic electro-conductive film are temporarily fixed at the placed positions by the adhesion force.

Then, as shown in FIG. 2 (*c*), the position fixing resin 4 is applied. Besides, the coating thickness is set at a height lower than the heights of the chip components 2. Because of this, if the applied position fixing resin 4 sets, as shown in FIG. 2 (*d*), the structure is obtained, in which the chip components 2 are fixed with the top portions of the chip components 2 exposed.

If the position fixing resin 4 is applied and set around the chip components 2, even if the applied position fixing resin has at most an amount to allow the top portions of the chip components 2 to be exposed, it is possible to easily fix the chip components 2. And, after the position fixing resin 4 is set, the elastic sheet 5 is placed on the chip components 2; heated at the predetermined temperature; and pressed at the predetermined pressure via the press-bonding head 8 to perform the press-bonding at a time.

Besides, a press-down amount during the press-bonding is very slight (e.g., about 10 nm), so that the press-bonding condition (pressing condition) may be the same as that for the conventional method that does not use the position fixing resin 4. As described above, the chip components 2 are fixed via the position fixing resin 4, so that it is possible to prevent displacement of the chip components 2 that occurs during the press-bonding. Besides, the position fixing resin 4 has a component protection function to prevent the chip component 2 from coming off. Besides, the position fixing resin fills the gaps between the chip components, so that the position fixing resin has a functional effect of insulating the chip components from each other.

Figure 3:
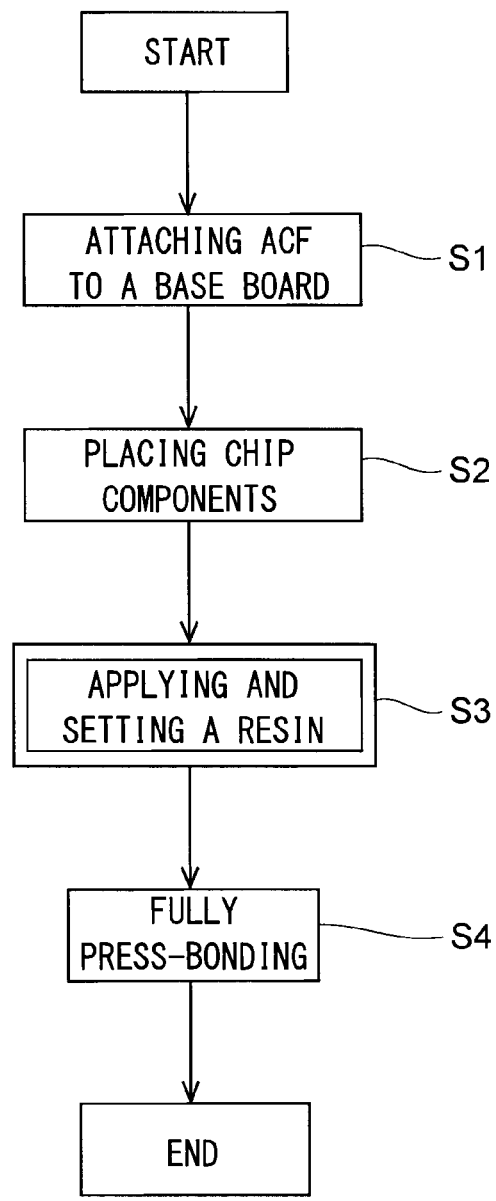
FIG. 3 is a flow chart showing a procedure of a chip component mounting method according to the present invention.

Next, by using a flow chart shown in FIG. 3, an operation procedure of the chip component mounting method is described.

If the chip component mounting operation is started, first, the anisotropic electro-conductive film 7 (ACF) is applied onto the base board (step S1). And, on the applied anisotropic electro-conductive film 7, the chip component is placed (step S2); and the position fixing resin is applied and set (step S3). After the resin is set, the heating and pressing are performed under the predetermined condition to perform the full press-bonding (step S4); and the chip component mounting operation ends. The resin applying and setting operations performed in the step S3 indicated in the double box in this figure is a characterizing part of the method according to the present invention.

As described above, the chip component mounting method according to the present embodiment is a chip component mounting method which attaches the anisotropic electro-conductive films 7 at the predetermined positions on the base board 1; places the chip components 2 on the anisotropic electro-conductive films 7; applies and sets the position fixing resin 4; thereafter, places the elastic sheet 5 on the chip components 2; performs the heating at the predetermined temperature; performs the pressing at the predetermined pressure via the press-bonding head 8 to perform the press-bonding at a time. In other words, a chip component mounting method is obtained which interposes the position fixing resin 4 that maintains the placed attitudes of the chip components 2 which are placed on the anisotropic electro-conductive film 7.

According to the above chip component mounting method, after the plurality of chip components 2 are placed on the base board 1 via the anisotropic electro-conductive film 7, the position fixing resin 4 is applied and set to perform the press-bonding; accordingly, even if the elastic sheet 5 is deformed and the force is exerted in the lateral direction when performing the press-bonding with the elastic sheet 5 placed, a chip component mounting method is obtained which is able to prevent the chip components 2 from deviating sideward, which is preferable.

In the conventional method in which the position fixing resin 4 is not interposed, when press-bonding a plurality of different kinds of chip components at the same time, the deformation amount of the elastic sheet 5 becomes large in a case where the unevenness in the height dimensions is large, so that during the press time, not only force in a press direction (direction perpendicular to the base board) but also force in a lateral direction (direction horizontal to the base board) occur. Besides, if the lateral-direction force occurs, the chip component deviates from the position to be mounted, which raises a problem that the electrical connection reliability between the electrode portions such as the connection bump and the like and the desired chip components is damaged.

However, in the chip component mounting method according to the present embodiment, the press-bonding is performed with the elastic sheet 5 placed in the state where the position fixing resin 4 is interposed to fix and prevent the chip component 2 from deviating sideward; accordingly, even if the plurality of chip components 2, which are different from each other in kind and have a large unevenness in height dimension, are press-boned at the same time, it becomes possible to fix the chip components at the accurate positions without the sideward deviation.

Figure 4A:
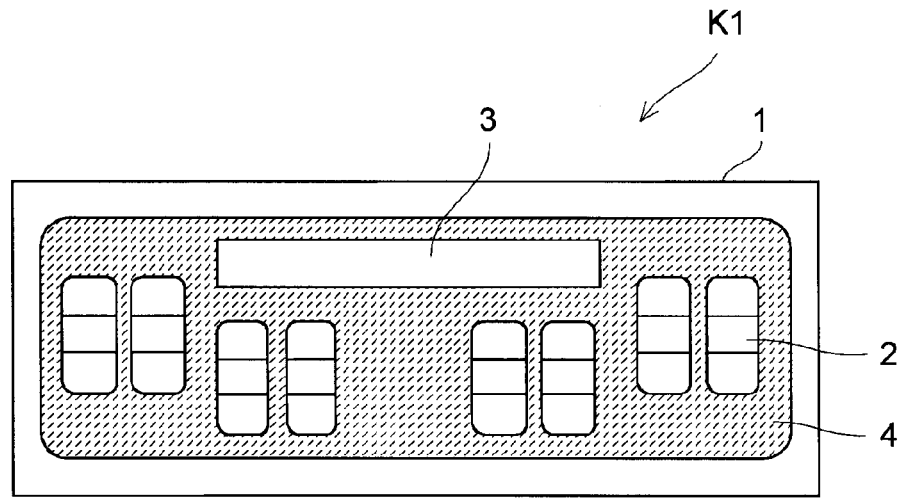
FIG. 4 is a schematic descriptive view of a first embodiment of a chip component mounting structure according to the present invention, of which (a) is a plan view; (b) is a front view; and (c) is a side view.
Figure 4B:
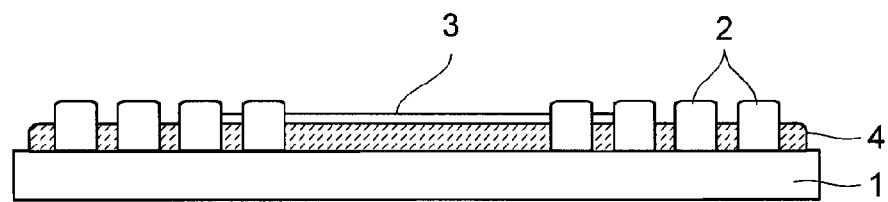
Figure 4C:
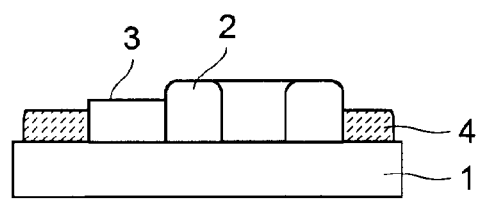

Next, by using FIG. 4, an embodiment of a chip component mounting structure according to the present invention is described.

A chip component mounting structure K1 shown in FIG. 4 (a) is a structure in which on the base board 1, the plurality of chip components 2 such as a chip capacitor, a chip resistor and the like and an IC 3 are placed; and the position fixing resin 4 for fixing these components is applied and set.

Besides, the application amount of the position fixing resin 4 has a height lower than the heights of all the components. Because of this, as shown in FIG. 4 (b), the position fixing resin 4 is set in the state where all the top portions of the chip components 2 and the IC 3 are exposed. Besides, as shown in FIG. 4 (c), the chip components 2 and the IC 3 are considerably different from each other in height; however, even in this case, an elastic sheet having a thickness larger than the height difference is placed and the heating and pressing are performed, whereby it becomes possible to perform the press-bonding at the accurate positions at a time without the sideward deviation.

Besides, the top portions of the chip components 2 are exposed, so that it becomes possible to exactly dispose other components on the chip components 2 in accordance with a predefined predetermined design dimension, which leads to a mounting structure that does not injure a desired performance of the base board.

Figure 5A:
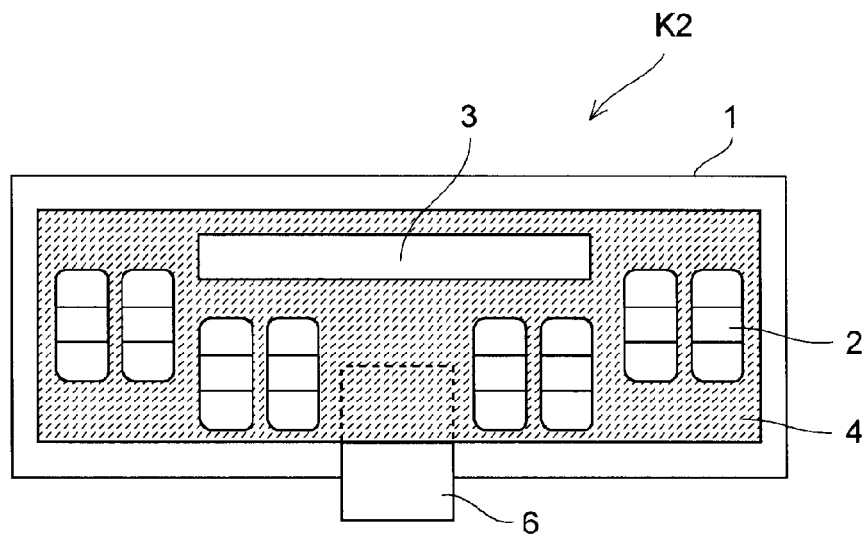
FIG. 5 is a schematic descriptive view of a second embodiment of a chip component mounting structure according to the present invention, of which (a) is a plan view; (b) is a front view; and (c) is a side view.
Figure 5B:
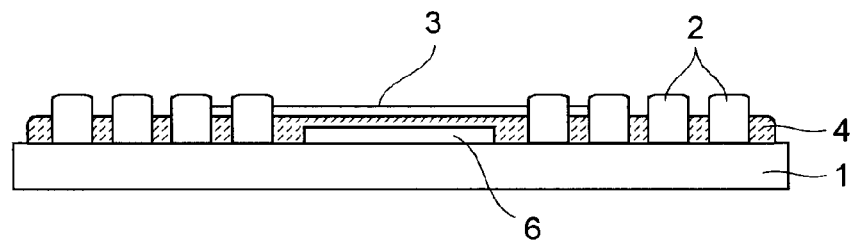
Figure 5C:
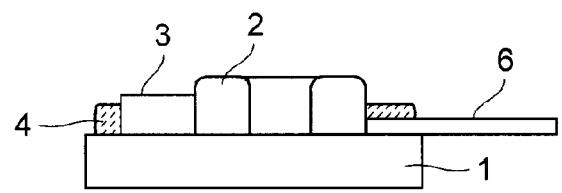

Next, by using FIG. 5, a second embodiment of the chip component mounting structure according to the present invention is described.

A chip component mounting structure K2 shown in FIG. 5 (a) is a structure in which on the base board 1, the plurality of chip components 2 such as a chip capacitor, a chip resistor and the like, the IC 3 and a flexible printed wiring board 6 are placed; and the position fixing resin 4 for fixing these components is applied and set. The thickness of the flexible printed wiring board 6 is thin, easily bendable and considerably different from the components such as the chip components 2 and the IC 3 in height.

Because of this, as shown in FIG. 5 (b), the application amount of the position fixing resin 4 has a height lower than the heights of the chip components 2 and the IC 3 and has a thickness higher than the flexible printed wiring board 6. In other words, the position fixing resin 4 is set in a state where the flexible printed wiring board 6 is covered and the top portions of the chip components 2 and the IC 3 are exposed. Besides, as shown in FIG. 5 (c), the flexible printed wiring board 6 is lower than, that is, considerably different from the chip components 2 and the IC 3 in height; however, even in this case, the position fixing resin 4 is applied and set on the flexible printed wiring board 6; the elastic sheet is placed on this; and the pressing is performed via the press-bonding head, whereby it becomes possible to press-bond the flexible printed wiring board 6 at a time at the same time as other components.

According to the above chip component mounting structure K2, even the flexible printed wiring board 6 having the thin thickness is able to be press-bonded to the base board 1 via the anisotropic electro-conductive film 7 at a time at the same time as the other components.

Besides, the top portions of the chip components 2 are exposed, so that it becomes possible to exactly dispose other members on the chip components 2 in accordance with a predefined predetermined design dimension, which leads to a mounting structure that does not injure a desired performance of the base board.

Figure 6A:
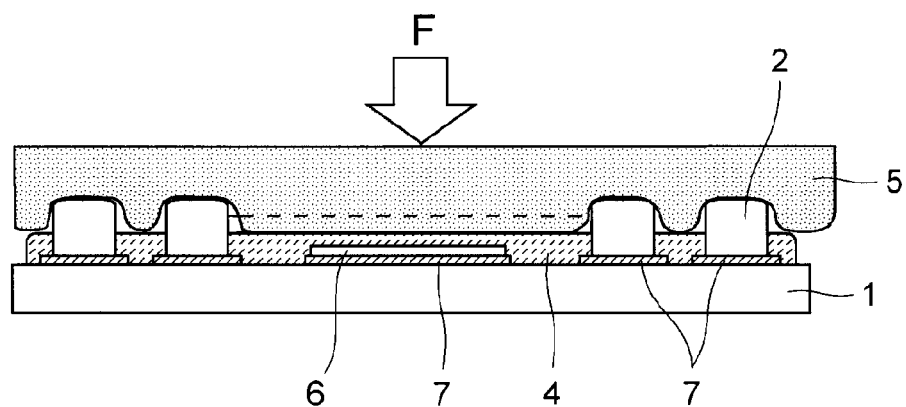
FIG. 6 is a schematic descriptive view of a mounting method according the second embodiment shown FIG. 5, of which (a) is a sectional view seen from front; and (b) is a side sectional view.
Figure 6B:
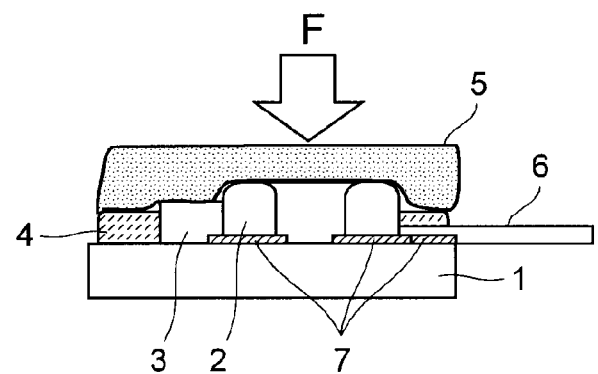
Figure 7A:
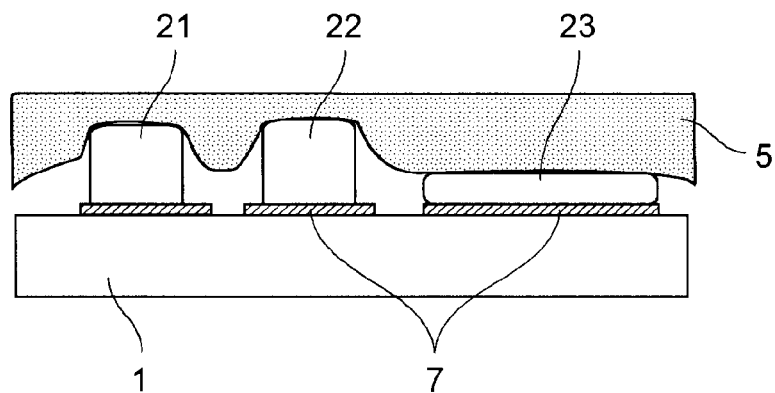
FIG. 7 is a schematic descriptive view of a conventional chip component mounting method, of which (a) is a sectional; and (b) is a plan sectional view.
Figure 7B:
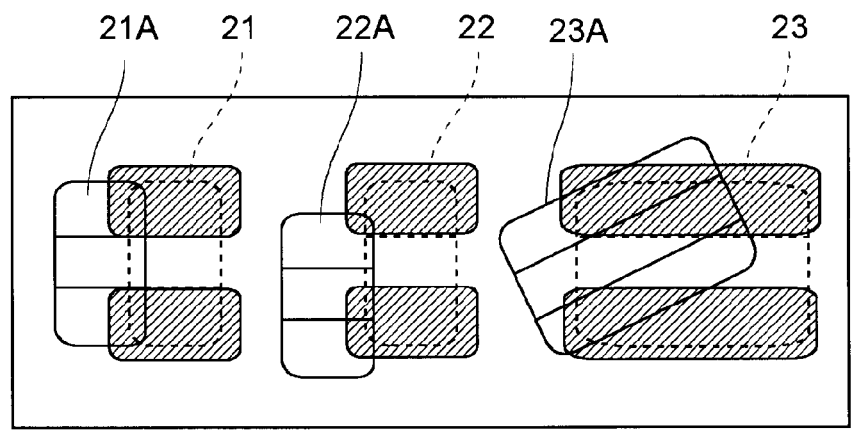

The mounting method of the above chip component mounting structure K2 is described again by using FIG. 6.

The mounting method of the chip component mounting structure K2 shown in FIG. 6 (a) is the method which applies the anisotropic electro-conductive film 7 to the connection portions such as the electrodes, the connection bumps and the like disposed on the base board 1; on the anisotropic electro-conductive film, places the plurality of chip components 2 such as the chip capacitor or the chip resistor, the IC 3 and the flexible printed wiring board 6; applies and sets the position fixing resin 4; thereafter, performs the pressing at the pressure F performing the heating with the elastic sheet 5 placed to perform the press-bonding at a time.

If the pressing is performed at the pressure F with the elastic sheet 5 placed, as shown in FIG. 6 (b), the pressure F acts on the top portions of the chip components 2 via the elastic sheet 5 to fully press-bond the anisotropic electro-conductive film 7 under the chip components 2. Besides, the pressure F acts on the top portion of the IC 3 via the elastic sheet 5 to fully press-bond the anisotropic electro-conductive film 7 under the IC 3.

Besides, as for the flexible printed wiring board 6, the pressure F acts on the position fixing resin 4 that covers the flexible printed wiring board 6 to fully press-bond the anisotropic electro-conductive film 7 under the flexible printed wiring board 6.

As described above, even in the case where there is a large difference between the height of the chip component 2 and the height of the flexible printed wiring board 6, by interposing the position fixing resin 4, it becomes possible to press-bond the flexible printed wiring board 6 along with the chip components 2 at a time.

It is preferable that the coating thickness of the position fixing resin 4 is thinner than the heights of the chip components 2 and thicker than the height of the flexible printed wiring board 6. Besides, in a case where the heights of the plurality of chip components 2 are different from each other, it is preferable that the coating thickness is made to have a height lower than the height of the highest chip component 2. Besides, if the coating thickness is made thick, the difference from the highest chip component becomes small; accordingly, by making the thickness of the elastic sheet 5 thin in accordance with the difference, it is possible to press-bond the chip components 2, the IC 3 and the flexible printed wiring board 3 at a time.

The base board having the above-described chip component mounting structure is preferably used as a base board of a liquid crystal display panel. Because of this, it is possible to obtain a liquid crystal display device that includes a backlight unit and a liquid crystal display panel which has the baseboard that is obtained by placing the plurality of chip components on the base board via the anisotropic electro-conductive film; press-bonding to mount the chip components at a time by using the press-bonding head; and performing the press-bonding with the interposed position fixing resin that maintains the placed attitudes of the chip components which are placed via the anisotropic electro-conductive film.

According to this structure, the chip components are press-bonded to the base board with the position fixing resin interposed, so that it is possible to prevent the sideward deviation that occurs during the press-bonding, which leads to a base board in which the chip components placed on the base board are mounted at the accurate positions. Because of this, the connection reliability between the base board and the chip components improves and it is possible to obtain a liquid crystal display device that fulfills the desired performance.

Here, it is preferable that the position fixing resin is a liquid-like setting resin; and it is preferable that the coating thickness is made lower than the heights of the chip components and set in the state where the top portions of the chip components are exposed. According to this structure, it is possible to apply the liquid-like setting resin by means of the dispenser method to the chip components that are held by the adhesion of the anisotropic electro-conductive film. Besides, the top portions of the chip components are exposed, so that it becomes possible to dispose the other members exactly in accordance with the predefined predetermined design dimension, which leads to a liquid crystal display device that does not injure the desired performance of the base board and fulfills the desired performance.

In addition, if the base board includes a flexible printed wiring board that has a height lower than the heights of the chip components, it is preferable that the coating thickness of the position fixing resin is made thicker than the height of the flexible printed wiring board. According to this structure, even in a case where there is a large difference between the height of the chip component 2 and the height of the flexible printed wiring board, by making the coating thickness of the position fixing resin thick, it is possible to press-bond the flexible printed wiring board along with the chip components via the position fixing resin at a time. Because of this, a liquid crystal display device is obtained which is able to: fix the chip components and the flexible printed wiring board at the accurate positions without the positional deviation; and fulfill the desired performance.

Hereinbefore, the embodiments of the present invention are described; however, the scope of the present invention is not limited to the embodiments, and it is possible to add various changes and put them into practical application without departing from the spirit of the present invention. For example, instead of the ultraviolet setting resin, it is possible to use a thermosetting resin. Besides, a structure may be employed which as the elastic sheet, uses a two-layer elastic sheet in which a first flexible elastic sheet and a second slightly hard elastic sheet are laminated.

As described above, according to the chip component mounting structure of the present invention, the chip component mounting structure is employed which is obtained by performing the press-bonding with the interposed position fixing resin that maintains the placed attitudes of the chip components which are placed on the base board via the anisotropic electro-conductive film, which leads to the chip component mounting structure which is able to prevent the sideward deviation that occurs during the press-bonding and mount the chip components placed on the base board at the accurate positions.

Besides, according to the chip component mounting method of the present invention, the chip component mounting method is employed which applies and sets the position fixing resin that maintains the placed attitudes of the chip components which are placed on the base board via the anisotropic electro-conductive film; thereafter, places the elastic sheet on the chip components; performs the heating at the predetermined temperature; performs the pressing at the predetermined pressure to perform the press-bonding at a time, which leads to the chip component mounting method which is able to prevent the chip components from deviating sideward even if the elastic sheet is deformed and the force is exerted in the lateral direction when performing the press-bonding with the elastic sheet placed.

In addition, according to the liquid crystal display device of the present invention, the base board is included on which the chip components are mounted at the accurate positions and in the correct attitudes, which leads to the liquid crystal display device that includes the base board on which the plurality of chip components having the different heights are accurately mounted; and fulfills the desired performance.

INDUSTRIAL APPLICABILITY

The chip component mounting structure and chip component mounting method according to the present invention are preferably applicable to a chip component mounting structure and a chip component mounting method that press-bond a plurality of chip components having different heights at a time.

REFERENCE SIGNS LIST 1 base board
2 chip component
3 IC
4 position fixing resin
5 elastic sheet
6 flexible printed wiring board
7 anisotropic electro-conductive film
8 press-bonding head

The invention claimed is:
1. A chip component mounting method which places a plurality of chip components on a base board via an anisotropic electro-conductive film; and performs press-bonding at a time by using a press-bonding head,
the chip component mounting method including the steps of:
mounting and temporarily fixing the chip components on the anisotropic electro-conductive film, the anisotropic electro-conductive film being arranged on the base board and having an adhesive property;
after the mounting and temporarily fixing step, applying and setting a position fixing resin around the chip components to contact side portions of the chip components to prevent a sideward deviation of, and to maintain placed attitudes of, the chip components;

after the applying and setting step, heating at a predetermined temperature with an elastic sheet placed on the chip components; and pressing at a predetermined pressure to perform the press-bonding.

2. The chip component mounting method according to claim 1, wherein the position fixing resin is a liquid-like setting resin and applied to a coating thickness lower than heights of the chip components; and the press-bonding is performed in a state where top portions of the chip components are exposed.

3. The chip component mounting method according to claim 1, wherein the position fixing resin is a liquid-like setting resin and applied to a coating thickness lower than a height of a highest chip component of the chip components; and is set with a top portion of the highest chip component exposed to perform the press-bonding.

4. The chip component mounting method according to claim 2, wherein the base board includes a flexible printed wiring board having a height lower than the heights of the chip components; and the position fixing resin has a coating thickness thicker than a height of the flexible printed wiring board.

5. The chip component mounting method according to claim 3, wherein the base board includes a flexible printed wiring board having a height lower than the heights of the chip components; and the position fixing resin has a coating thickness thicker than a height of the flexible printed wiring board.

* * * * *